(12) United States Patent
Kumazawa (10) Patent No.: US 11,824,464 B2
(45) Date of Patent: Nov. 21, 2023

(54) SEMICONDUCTOR DEVICE WITH SWITCHING ELEMENT PROTECTION

(71) Applicant: FUJI ELECTRIC CO., LTD., Kawasaki (JP)

(72) Inventor: Yuki Kumazawa, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 7 days.

(21) Appl. No.: 17/383,650

(22) Filed: Jul. 23, 2021

(65) Prior Publication Data

US 2022/0069735 A1 Mar. 3, 2022

(30) Foreign Application Priority Data

Aug. 31, 2020 (JP) .................................. 2020-146104

(51) Int. Cl.
*H02M 7/521* (2006.01)
*H03K 17/16* (2006.01)
(Continued)

(52) U.S. Cl.
CPC ........ *H02M 7/521* (2013.01); *H01L 29/7393* (2013.01); *H02M 7/05* (2021.05); *H02M 7/219* (2013.01); *H03K 17/162* (2013.01)

(58) Field of Classification Search
CPC ............ H02M 7/00; H02M 7/02; H02M 7/04; H02M 7/217; H02M 7/2173; H02M 7/219; H02M 7/05; H02M 7/42; H02M 7/44; H02M 7/515; H02M 7/521; H02M 1/0003; H02M 1/0009; H02M 1/0025; H02M 1/0029; H02M 1/0038; H02M 1/12–15; H02M 1/32; H02M 1/34–348; H02M 1/08; H02M 1/083; H02M 1/084; H01L 29/68; H01L 29/70; H01L 29/739; H01L 29/7393; H03K 17/16; H03K 17/161;
(Continued)

(56) References Cited

U.S. PATENT DOCUMENTS 6,570,369 B2 * 5/2003 Tamai ................ H03K 17/0822
323/283
9,819,338 B2 11/2017 Otake et al.
(Continued)

FOREIGN PATENT DOCUMENTS

JP 2015126342 A 7/2015

*Primary Examiner* — Thienvu V Tran
*Assistant Examiner* — Carlos O Rivera-Perez (57) ABSTRACT

The present invention is directed to provide a semiconductor device capable of protecting a switching element even though having a capacitor connected to a control signal input terminal of the switching element. Semiconductor device includes an IGBT including a gate configured to be input a gate signal and a current detection terminal used to detect at least one of overcurrent or short-circuit current, a gate capacitor arranged between the gate and a reference potential terminal, the gate capacitor being disconnected from the gate as needed, and a disconnection unit configured to disconnect a connection between the gate capacitor and the gate when a detection current being a current output from the current detection terminal is equal to or larger than a first current set on a basis of a minimum current causing oscillation in a loop circuit formed by including the IGBT and the gate capacitor.

18 Claims, 5 Drawing Sheets

(51) Int. Cl.
*H02M 7/04* (2006.01)
*H02M 7/219* (2006.01)
*H01L 29/739* (2006.01)

(58) Field of Classification Search
CPC .. H03K 17/162; H03K 17/165; H03K 17/168; H03K 17/08; H03K 17/081–08116; H03K 17/0812–08128; H02H 3/08; H02H 3/083; H02H 3/10; H02H 3/105; H02H 3/16
USPC ............ 363/50–58, 146, 147; 323/271–278, 323/282–285, 288, 289, 351, 908; 361/78, 79, 87, 93.1–102
See application file for complete search history.

(56) References Cited

U.S. PATENT DOCUMENTS

| | | |
|---|---|---|
| 10,320,380 B2 | 6/2019 | Otake et al. |
| 10,749,520 B2 | 8/2020 | Otake et al. |
| 2011/0156688 A1* | 6/2011 | Lin .................. H02M 3/00 323/284 |
| 2012/0153719 A1* | 6/2012 | Inaba .................. B60L 3/003 327/109 |
| 2016/0308523 A1 | 10/2016 | Otake et al. |
| 2018/0048306 A1 | 2/2018 | Otake et al. |
| 2019/0253047 A1 | 8/2019 | Otake et al. |
| 2021/0296979 A1* | 9/2021 | Ikarashi ............... H03K 17/162 |

* cited by examiner

SEMICONDUCTOR DEVICE WITH SWITCHING ELEMENT PROTECTION

CROSS-REFERENCE TO RELATED APPLICATION

This application claims benefit of priority under 35 USC 119 based on Japanese Patent Application No. 2020-146104 filed on Aug. 31, 2020, the entire contents of which are incorporated by reference herein.

TECHNICAL FIELD

The present invention relates to a semiconductor device applied to a power conversion device or the like.

BACKGROUND ART

Insulated gate bipolar transistors (IGBTs), bipolar transistors, and metal-oxide-semiconductor field-effect transistors (MOSFETs) are widely used as switching elements. In general, these switching elements are often used in the form of a power module in which a plurality of sets of a switching element and a free-wheeling diode (FWD) connected in anti-parallel to the switching element are incorporated in a single package. Additionally, intelligent power modules (IPMs) with a drive circuit and a protection function added to such a power module are also being actively developed. IPMs are often used in a 6-in-1 or 7-in-1 circuit form. Such intelligent power modules are applied to inverters, power conditioners, numerical control (NC) working machines, and the like.

IPMs generally include a sense IGBT having a detection terminal for detecting overcurrent and short-circuit current flowing through an IGBT. The detection terminal provided in the sense IGBT outputs a sense emitter current that is approximately a few thousandths or a few ten thousandths of a current flowing between a collector and an emitter of the sense IGBT. IPMs include an overcurrent/short-circuit protection circuit for protecting an IGBT from overcurrent and short-circuit current by using the above-mentioned sense emitter current. The overcurrent/short-circuit protection circuit includes a current detection resistor between a sense emitter and a ground, detects a voltage drop across the current detection resistor, and turns on an IGBT gate terminal discharging switch to ensure that overcurrent or short-circuit current flowing through the IGBT is interrupted.

IPMs include a gate capacitor connected to a control signal input terminal of a switching element (for example, a gate of the IGBT). The gate capacitor is used to adjust a recovery dv/dt when the switching element switches from an off state to an on state (i.e., at turn-on). The gate capacitor is effective in suppressing radiated noise when the switching element is turned on. In general, switching elements tend to have higher radiated noise in a low current range than in a high current range. In IPMs, the gate capacitor is generally mounted on a control board (printed circuit board).

However, for example, when the gate capacitor is connected to the gate of the IGBT, a loop circuit is formed among the emitter of the IGBT, the control board, the gate capacitor, and the gate of the IGBT. As a result, due to an occurrence of a steep current change (high di/dt) that is likely to occur upon short circuit of the IGBT, LC oscillation occurs in the loop circuit. Particularly, since sense IGBTs are low in withstand voltage, the sense IGBT may be broken, and the protection function may be lost when the LC oscillation occurs.

PTL 1 discloses a power circuit including a plurality of metal-insulator-semiconductor field-effect transistors (MISFETs) each including a source sense. The power circuit includes a gate diode connected between a gate and the source sense as a means of suppressing malfunction and parasitic oscillation. The gate diode has an anode connected to the source sense and a cathode connected to the gate. PTL 1 discloses that by connecting the gate diode in this way, vibration and oscillation of a gate-source voltage when voltage is applied to a gate-source capacitance in a negative direction can be suppressed, and stable operation can be obtained, as well as a simple circuit configuration can be used, thus enabling miniaturization.

CITATION LIST

Patent Literature

PTL 1: JP 2015-126342 A

SUMMARY OF INVENTION

Technical Problem

However, the power circuit disclosed in PTL 1 is not configured so as to solve the problem caused by mounting a gate capacitor. Therefore, the switching elements may be broken by parasitic oscillation.

It is an object of the present invention to provide a semiconductor device capable of protecting a switching element even though including a capacitor connected to a control signal input terminal of the switching element.

Solution to Problem

In order to achieve the above object, a semiconductor device according to one aspect of the present invention includes a switching element including a control signal input terminal configured to be input a switching control signal and a current detection terminal used to detect at least one of overcurrent or short-circuit current, a capacitor arranged between the control signal input terminal and a reference potential terminal, the capacitor being disconnected from the control signal input terminal as needed, and a disconnection unit configured to disconnect a connection between the capacitor and the control signal input terminal when a detection current being a current output from the current detection terminal is equal to or larger than a first current set on a basis of a minimum current causing oscillation in a loop circuit formed by including the switching element and the capacitor.

Advantageous Effects of Invention

According to the one aspect of the present invention, the switching element can be protected even though there is had a capacitor connected to the control signal input terminal of the switching element.

DESCRIPTION OF EMBODIMENTS

An embodiment of the present invention exemplifies devices and methods for embodying the technological idea of the invention, and is not intended to limit the materials, shapes, structures, arrangement, and the like of components to those described below. Various modifications can be added to the technological idea of the present invention in the technological scope defined by the claims described in CLAIMS.

Configuration of Power Conversion Device

A power conversion device 1 including semiconductor devices 2a according to the present embodiment will be described in FIG. 1. Hereinafter, an inverter circuit will be exemplified as the power conversion device 1 including the semiconductor devices 2a according to the present embodiment. However, the semiconductor device 2a is applicable not only to an inverter circuit, but also to a power conversion device such as a converter circuit or a full-bridge circuit.

Figure 1:
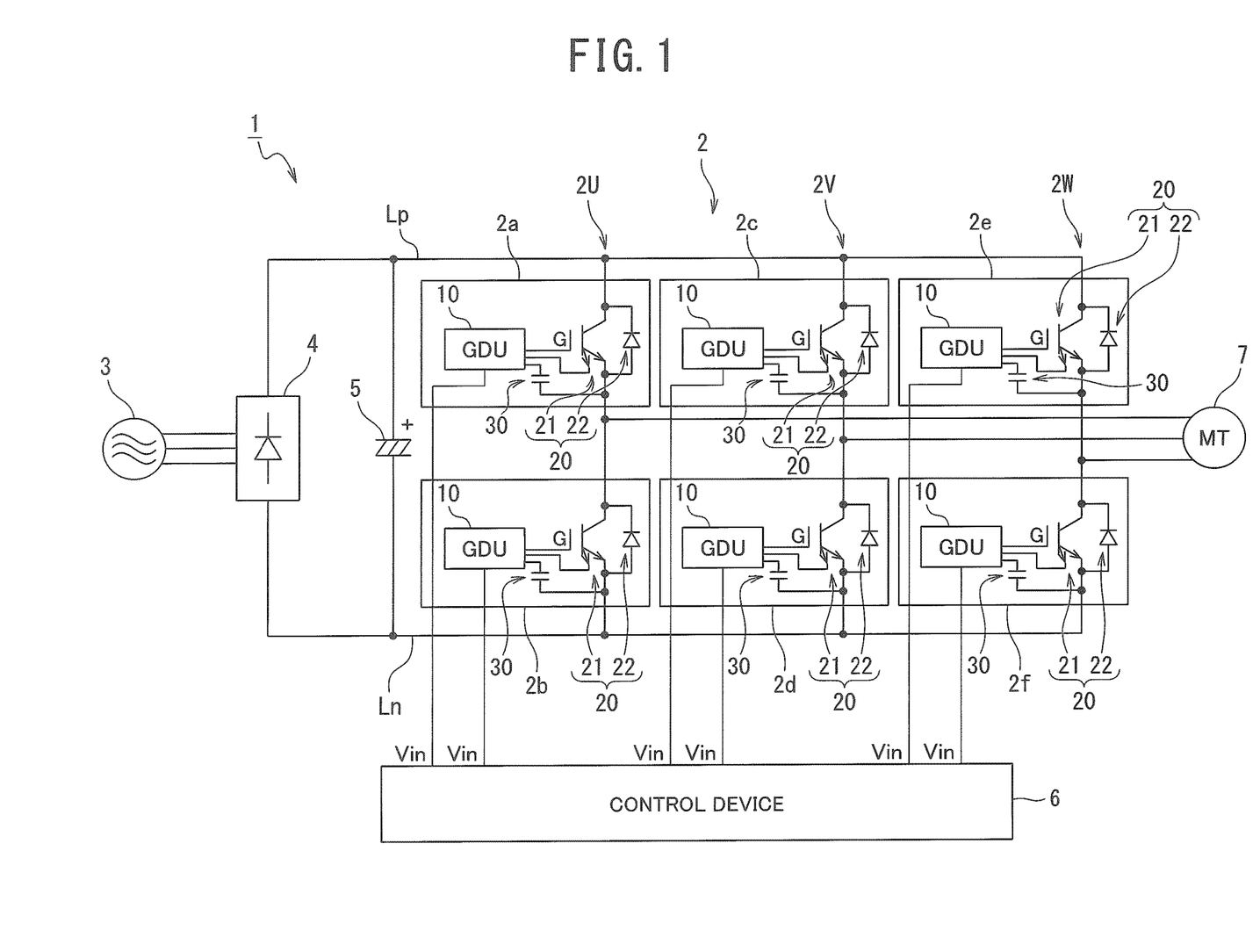
FIG. 1 is a circuit diagram illustrating a schematic structure of a power conversion device including a semiconductor device according to an embodiment of the present invention.

As illustrated in FIG. 1, the power conversion device 1 is connected to a three-phase AC power supply 3. The power conversion device 1 includes a rectifier circuit 4 configured to full-wave rectify a three-phase AC power input from the three-phase AC power supply 3 and a smoothing capacitor 5 configured to smooth the power rectified by the rectifier circuit 4. Although illustration of the rectifier circuit 4 is omitted, the rectifier circuit 4 is formed using six diodes connected in a full bridge or six switching elements connected in a full bridge.

A positive line Lp is connected to a positive output terminal of the rectifier circuit 4, and a negative line Ln is connected to a negative output terminal thereof. The smoothing capacitor 5 is connected between the positive line Lp and the negative line Ln. Additionally, the power conversion device 1 includes an inverter circuit 2 configured to convert a DC voltage applied between the positive line Lp and the negative line Ln to a three-phase AC voltage. The inverter circuit 2 includes semiconductor devices 2a, 2c, and 2e having an insulated gate bipolar transistor (an example of a switching element) 21, for example, as a voltage-controlled semiconductor element, and forming an upper arm section connected to the positive line Lp and semiconductor devices 2b, 2d, and 2f including an insulated gate bipolar transistor 21 and forming a lower arm section connected to the negative line Ln. Hereinafter, the insulated gate bipolar transistor will be abbreviated to "IGBT".

The IGBT 21 included in the semiconductor device 2a and the IGBT 21 included in the semiconductor device 2b are connected in series between the positive line Lp and the negative line Ln to form a U-phase output arm 2U. The IGBT 21 included in the semiconductor device 2c and the IGBT 21 included in the semiconductor device 2d are connected in series between the positive line Lp and the negative line Ln to form a V-phase output arm 2V. The IGBT 21 included in the semiconductor device 2e and the IGBT 21 included in the semiconductor device 2f are connected in series between the positive line Lp and the negative line Ln to form a W-phase output arm 2W.

A free-wheeling diode 22 is connected in anti-parallel to each IGBT 21 included in the semiconductor devices 2a, 2b, 2c, 2d, 2e, and 2f (hereinafter, "the semiconductor devices 2a, 2b, 2c, 2d, 2e, and 2f" may be abbreviated to "the semiconductor devices 2a to 2f"). Details of the IGBT 21 and the free-wheeling diode 22 will be described later.

A connection portion between the IGBT 21 included in the semiconductor device 2a and the IGBT 21 included in the semiconductor device 2b, a connection portion between the IGBT 21 included in the semiconductor device 2c and the IGBT 21 included in the semiconductor device 2d, and a connection between the IGBT 21 included in the semiconductor device 2e and the IGBT 21 included in the semiconductor device 2f, respectively, are connected to a load, for example, a motor 7.

Each of the semiconductor devices 2a to 2f includes a gate drive circuit (an example of a control circuit) 10 configured to individually control switching operation of the IGBT 21. In FIG. 1, the gate drive circuit 10 is denoted as "GDU". In each of the semiconductor devices 2a to 2f, an output terminal of the gate drive circuit 10 is connected to a gate (an example of a control signal input terminal) G of the IGBT 21. Additionally, each of the semiconductor devices 2a to 2f includes a gate capacitor (an example of a capacitor) 30 connected to the gate drive circuit 10. Details of the gate drive circuit 10 and the gate capacitor 30 will be described later.

The inverter circuit 2 includes a three-phase full-bridge circuit in which the U-phase output arm 2U, the V-phase output arm 2V, and the W-phase output arm 2W are connected in parallel, the semiconductor devices 2a and 2b controlling the switching operation of the U-phase output arm 2U, the semiconductor devices 2c and 2d controlling the switching operation of the V-phase output arm 2V, and the semiconductor devices 2e and 2f controlling the switching operation of the W-phase output arm 2W.

The power conversion device 1 includes a control device 6 configured to control the gate drive circuit 10 included in each of the semiconductor devices 2a to 2f. The control device 6 is configured to individually output, for example, a pulsed input signal Vin to the gate drive circuit 10 included in each of the semiconductor devices 2a to 2f. This allows the control device 6 to control the gate drive circuit 10 included in each of the semiconductor devices 2a to 2f to drive the IGBT 21 included in each of the semiconductor devices 2a to 2f by, for example, pulse width modulation (PWM).

Semiconductor Device

Next, the semiconductor device according to the present embodiment will be described in FIGS. 2 to 5 with reference to FIG. 1. The semiconductor devices 2a to 2f included in the power conversion device 1 are the same in configuration and operation. Therefore, the following will be a description of the semiconductor devices 2a to 2f using the semiconductor device 2a as an example.

Configuration of Semiconductor Device

A schematic configuration of the semiconductor device 2a according to the present embodiment will be described in FIG. 2 with reference to FIG. 1.

Figure 2:
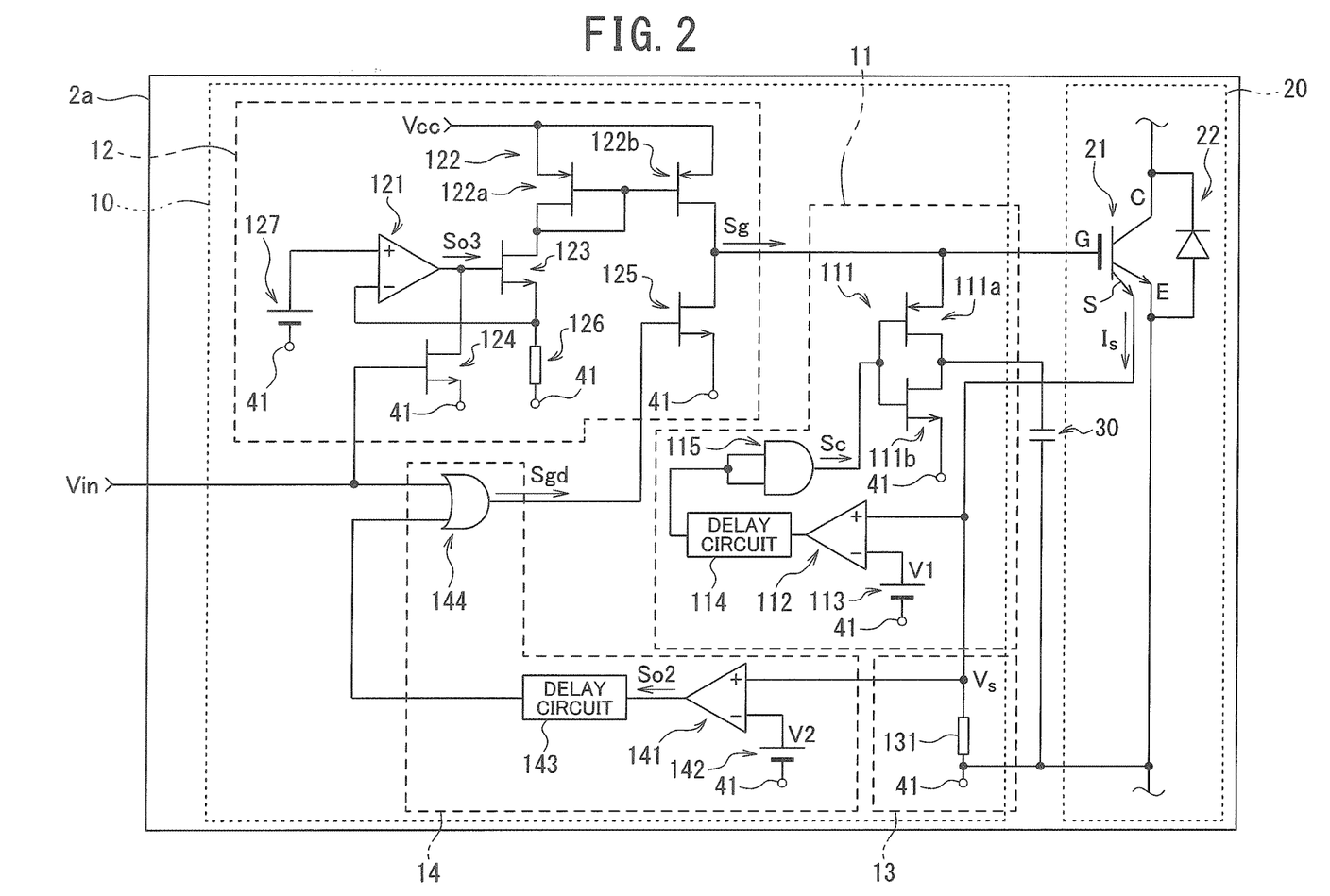
FIG. 2 is a circuit diagram illustrating a schematic structure of the semiconductor device according to an embodiment of the present invention.

As illustrated in FIG. 2, the semiconductor device 2a includes the IGBT (an example of the switching element) 21 including the gate (an example of the control signal input terminal) G configured to be input a gate signal (an example of a switching control signal) Sg and a current detection terminal S used to detect at least one of overcurrent or short-circuit current. Additionally, the semiconductor device 2a includes the gate capacitor (an example of the capacitor) 30 arranged between the gate G and a reference potential terminal 41, the gate capacitor 30 being disconnected from the gate G as needed. Furthermore, the semiconductor device 2a includes a disconnection unit 11 configured to disconnect a connection between the gate capacitor 30 and the gate G when a detection current Is being a current output from the current detection terminal S is equal to or larger than a first current set on a basis of a minimum current causing oscillation in a loop circuit L (see FIG. 4) formed by including the IGBT 21 and the gate capacitor 30. The reference potential terminal 41 is connected to an output terminal of the inverter circuit 2 in the semiconductor devices 2a, 2c, and 2e forming the upper arm section of the inverter circuit 2 (see FIG. 1), and is connected to a ground terminal (earth terminal) in the semiconductor devices 2b, 2d, and 2f forming the lower arm section of the inverter circuit 2.

The gate capacitor 30 is provided to reduce a recovery voltage change rate during switching of the IGBT 21. The first current is set to a predetermined value according to an absolute maximum rated current of the IGBT 21. In this way, the semiconductor device 2a prevents the IGBT 21 from being damaged due to an overvoltage applied between the gate G of the IGBT 21 and the current detection terminal S by the oscillation in the loop circuit L.

The semiconductor device 2a includes a current detection unit 13 configured to detect the detection current Is as a voltage. Additionally, the semiconductor device 2a includes a gate signal generation unit (an example of a control signal generation unit) 12 configured to generate the gate signal Sg and a protection unit 14 configured to protect the IGBT 21 by preventing the gate signal Sg output from the gate signal generation unit 12 from being input to the gate G when the detection current Is is equal to or larger than a second current set on a basis of the absolute maximum rated current of the IGBT 21.

Although details will be described later, the second current is set to, for example, a value twice or more than the absolute maximum rated current of the IGBT 21. This allows the semiconductor device 2a to detect at least one of overcurrent or short-circuit current flowing through the IGBT 21 and prevent the IGBT 21 from being damaged.

Figure 4A:
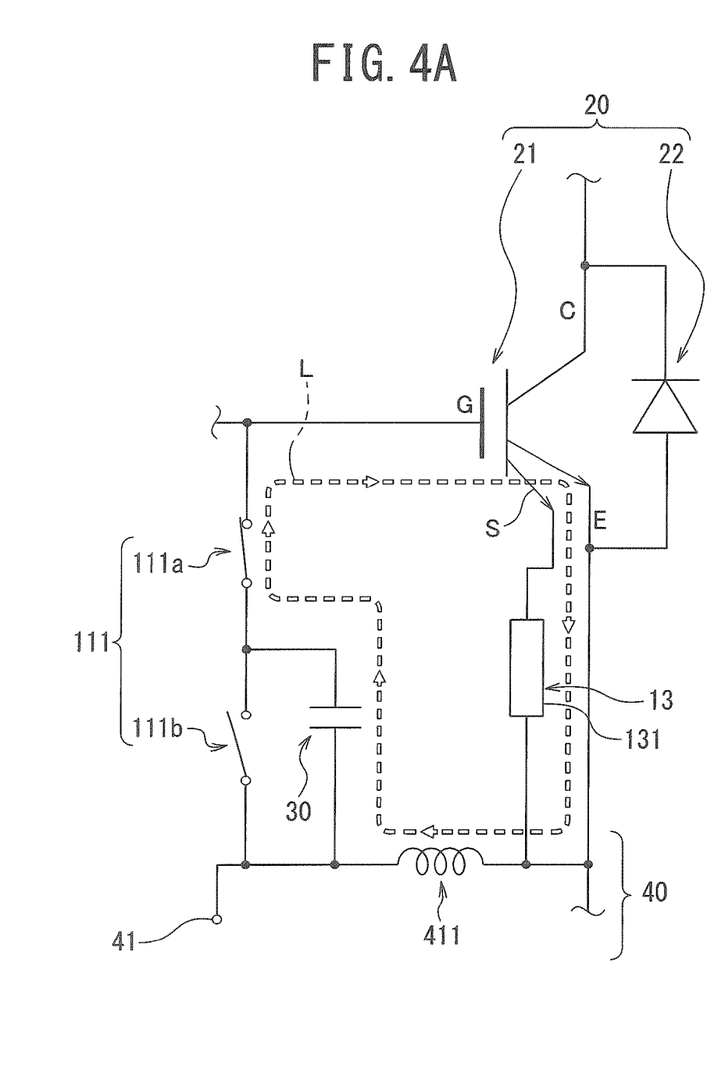
FIGS. 4A and 4B are a diagram for explaining effects of the semiconductor device according to an embodiment of the present invention, which is a diagram for illustrating a loop circuit including a gate capacitor.
Figure 4B:
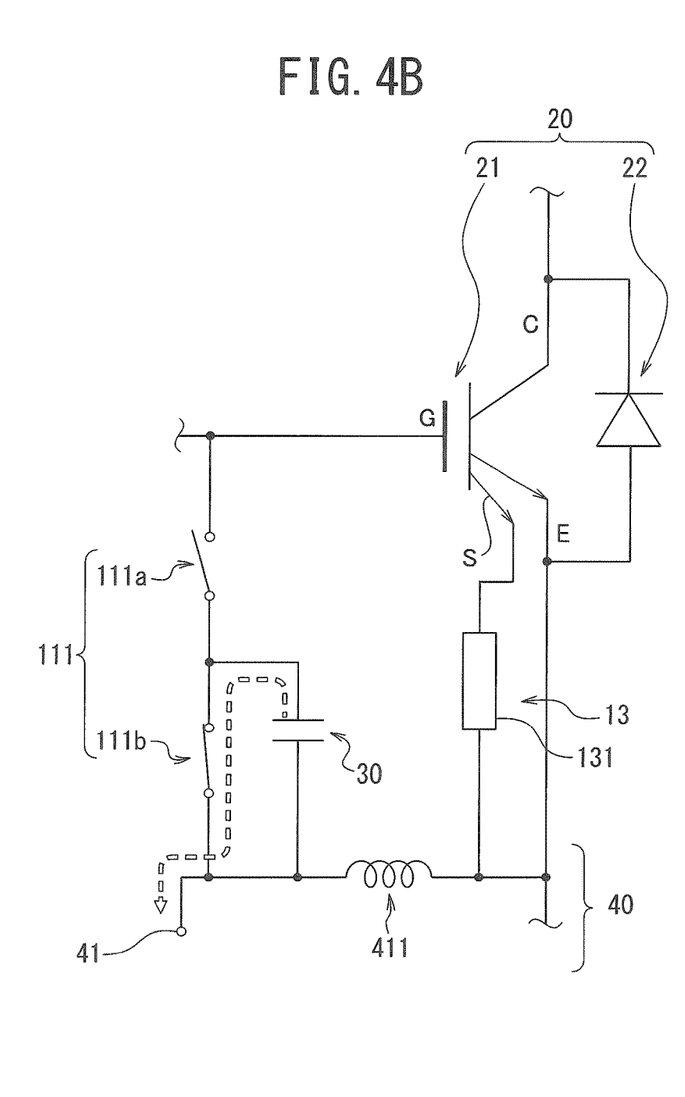

The semiconductor device 2a includes the gate drive circuit (an example of the control circuit) 10 including a semiconductor substrate (unillustrated), the disconnection unit 11, the current detection unit 13, the gate signal generation unit 12, and the protection unit 14 formed on the semiconductor substrate and control the IGBT 21. The gate capacitor 30 is connected to the gate drive circuit 10. The semiconductor device 2a includes a printed circuit board (an example of a circuit board) 40 (unillustrated in FIG. 2; see FIG. 4) mounted with the gate drive circuit 10 and the gate capacitor 30. The reference potential terminal 41 is formed, for example, on the printed circuit board 40.

The semiconductor device 2a includes a semiconductor element 20 including the IGBT 21 and the free-wheeling diode (an example of a diode) 22 connected in anti-parallel to the IGBT 21. A cathode of the free-wheeling diode 22 is connected to a collector C of the IGBT 21, and an anode of the free-wheeling diode 22 is connected to an emitter E of the IGBT 21. The semiconductor element 20 and the printed circuit board 40 are formed in a module configuration packaged in one.

The IGBT 21 is a composite element including a main IGBT with flow of a main current being a current to be supplied to the motor 7 and a sense IGBT with flow of the detection current Is for detecting a current that flows through the main IGBT. A gate of the main IGBT and a gate of the sense IGBT are connected to each other to be the gate G of the IGBT 21. A collector of the main IGBT and a collector of the sense IGBT are connected to each other to be the collector C of the IGBT 21. An emitter of the main IGBT is the emitter E of the IGBT 21. An emitter of the sense IGBT is the current detection terminal S of the IGBT 21. The detection current Is is very much smaller than the main current, and has a current amount of, for example, about $1/10,000$ of the main current.

The collector C of the IGBT 21 included in each of the semiconductor devices 2a, 2c, and 2e (see FIG. 1) is connected to the positive line Lp (see FIG. 1). The emitter E of the IGBT 21 included in the semiconductor device 2a is connected to the collector C of the IGBT 21 included in the semiconductor device 2b (see FIG. 1). The emitter E of the IGBT 21 included in the semiconductor device 2c is connected to the collector C of the IGBT 21 included in the semiconductor device 2d (see FIG. 1). The emitter E of the IGBT 21 included in the semiconductor device 2e is connected to the collector C of the IGBT 21 included in the semiconductor device 2f (see FIG. 1). The emitter E of the IGBT 21 included in each of the semiconductor devices 2b, 2d, and 2f is connected to the positive line Ln (see FIG. 1).

As illustrated in FIG. 2, the gate signal generation unit 12 includes a voltage generation unit 127. The voltage generation unit 127 is configured by, for example, a DC power supply. A negative side of the voltage generation unit 127 is connected to the reference potential terminal 41. The gate signal generation unit 12 includes an amplifier 121 configured to input a voltage generated by the voltage generation unit 127. The gate signal generation unit 12 includes a MOS transistor 123 including a gate in which an output signal So3 output from the amplifier 121 is input. The amplifier 121 is configured by, for example, an operational amplifier. The MOS transistor 123 is, for example, an N-type MOS transistor. An output terminal of the amplifier 121 is connected to the gate of the MOS transistor 123. A non-inverting input terminal (+) of the amplifier 121 is connected to a positive side of the voltage generation unit 127.

The gate signal generation unit 12 includes a current mirror circuit 122 connected to a drain of the MOS transistor 123 and a resistor element 126 connected to a source of the MOS transistor 123. One terminal of the resistor element 126 is connected to the source of the MOS transistor 123, and the other terminal of the resistor element 126 is connected to the reference potential terminal 41. A connection portion between the source of the MOS transistor 123 and the one terminal of the resistor element 126 is connected to an inverting input terminal (−) of the amplifier 121.

The current mirror circuit 122 includes a MOS transistor 122a and a MOS transistor 122b whose gates are connected to each other. The MOS transistor 122a and the MOS transistor 122b, respectively, are configured by, for example, a P-type MOS transistor. A source of the MOS transistor 122a is connected to a power supply output terminal that outputs a power supply voltage Vcc, and a drain of the MOS transistor 122a is connected to the gates of the MOS transistors 122a and 122b and the drain of the MOS transistor 123.

The gate signal generation unit 12 includes a MOS transistor 124 whose gate is connected to the control device 6 (unillustrated in FIG. 2; see FIG. 1). The MOS transistor 124 is, for example, an N-type MOS transistor. An input signal Vin output from the control device 6 is input to a gate of the MOS transistor 124. In this way, an on/off state (conduction/non-conduction state) of the MOS transistor 124 is controlled by the control device 6. The MOS transistor 124 goes into the on state (conduction state) when the input signal Vin has a high voltage level, and goes into the off state (non-conduction state) when the input signal Vin has a low voltage level.

A source of the MOS transistor 124 is connected to the reference potential terminal 41. A drain of the MOS transistor 124 is connected to the output terminal of the amplifier 121 and the gate of the MOS transistor 123.

A constant current circuit is configured by the amplifier 121, the MOS transistor 123, and the resistor element 126. The amplifier 121 outputs to the gate of the MOS transistor 123 the output signal So3 at a voltage level where a value of voltage drop across the resistor element 126 is equal to the voltage generated by the voltage generation unit 127. This causes a predetermined constant current to flow through the MOS transistor 122a included in the current mirror circuit 122. Furthermore, the current mirror circuit 122 outputs a current having the same current amount as the constant current to the gate G of the IGBT 21 as a gate current from the MOS transistor 122b. Thus, the MOS transistor 122b included in the current mirror circuit 122 serves as a charging switch for charging the gate G of the IGBT 21.

On the other hand, when the MOS transistor 124 is in the on state, the gate of the MOS transistor 123 is electrically connected to the reference potential terminal 41 via the MOS transistor 124, whereby the MOS transistor 123 is turned off. This prevents the current mirror circuit 122 from passing current through the MOS transistor 123 and the resistor element 126 from the MOS transistor 122a, so that it is not possible to pass a gate current through the gate G of the IGBT 21 from the MOS transistor 122b.

The gate signal generation unit 12 includes a MOS transistor 125 arranged between the current mirror circuit 122 and the reference potential terminal 41. A drain of the MOS transistor 125 is connected to a drain of the MOS transistor 122b. A source of the MOS transistor 125 is connected to the reference potential terminal 41. A gate of the MOS transistor 125 is connected to an output terminal of a logic circuit 144 (details will be described later) included in the protection unit 14. Therefore, A protection signal Sgd (details will be described later) output from the logic circuit 144 is input to the gate of the MOS transistor 125. As a result, an on/off state (conduction/non-conduction state) of the MOS transistor 125 is controlled by the protection unit 14. When the protection signal Sgd has a high voltage level, the MOS transistor 125 goes into the on state (conduction state) and electrically connects the gate G of the IGBT 21 to the reference potential terminal 41. On the other hand, when the protection signal Sgd has a low voltage level, the MOS transistor 125 goes into the off state (non-conduction state) and electrically disconnects the gate G of the IGBT 21 from the reference potential terminal 41. Thus, the MOS transistor 125 serves as a discharging switch for discharging electric charge charged in the gate G of the IGBT 21 and the gate capacitor 30 to the reference potential terminal 41.

As illustrated in FIG. 2, the current detection unit 13 includes a resistor element 131 connected between the current detection terminal S of the IGBT 21 and the reference potential terminal 41. One terminal of the resistor element 131 is connected to the current detection terminal S, and the other terminal of the resistor element 131 is connected to the reference potential terminal 41. The current detection unit 13 is configured to output as a detection voltage Vs a voltage drop generated in the resistor element 131 by the detection current Is output from the current detection terminal S and flowing through the resistor element 131. In other words, the current detection unit 13 outputs as the detection voltage Vs the voltage at the one terminal of the resistor element 131 connected to the current detection terminal S.

As illustrated in FIG. 2, the protection unit 14 includes a comparator 141 connected to the current detection unit 13 and a voltage generation unit 142 for generating a reference voltage used as a reference for comparison made by the comparator 141. The protection unit 14 includes a delay circuit 143 arranged at an output side of the comparator 141 and a logic circuit 144 arranged at an output side of the delay circuit 143.

The voltage generation unit 142 is configured by, for example, a DC power supply. A negative side of the voltage generation unit 142 is connected to the reference potential terminal 41. The voltage generation unit 142 is adapted to generate a comparison voltage V2 at a predetermined voltage level. The comparison voltage V2 is set to a higher voltage than (for example, a voltage of from 1.5 times to 2 times) a voltage corresponding to the absolute maximum rated current of the IGBT 21.

The comparator 141 is, for example, a hysteresis comparator configured by an operational amplifier and an unillustrated resistor element. A non-inverting input terminal (+) of the comparator 141 is connected to the current detection terminal S and the one terminal of the resistor element 131. An inverting input terminal (−) of the comparator 141 is connected to a positive side of the voltage generation unit 142. An output terminal of the comparator 141 is connected to an input terminal of the delay circuit 143. When the detection voltage Vs input from the current detection unit 13 is equal to or higher than the comparison voltage V2 generated by the voltage generation unit 142 (i.e., the comparison voltage V2 or higher), the comparator 141 outputs an output signal So2 at a high voltage level to the delay circuit 143. Additionally, when the detection voltage Vs is lower than the comparison voltage V2, the comparator 141 outputs the output signal So2 at a low voltage level to the delay circuit 143.

The input terminal of the delay circuit 143 is connected to the output terminal of the comparator 141. An output terminal of the delay circuit 143 is connected to an input terminal of the logic circuit 144 (details will be described later). Therefore, the output signal So2 output from the comparator 141 is input to the delay circuit 143. The delay circuit 143 is configured by, for example, an RC filter. The delay circuit 143 delays the output signal So2 input from the comparator 141 by a predetermined time and outputs it to the logic circuit 144.

Incidentally, a sudden noise may occur in the power conversion device 1, and the noise may be superimposed on a collector-emitter current flowing through the IGBT 21. In this case, the detection voltage Vs is higher than the comparison voltage V2 even though there is no overcurrent or short-circuit current flowing through the IGBT 21. Due to that, the comparator 141 outputs the output signal So2 at a suddenly increased voltage level to the delay circuit 143. The delay circuit 143 can delay and remove the output signal So2 at the suddenly increased voltage level. This allows the protection unit 14 to prevent malfunction due to the sudden noise. Furthermore, the delay circuit 143 functions as a low-pass filter, and thus can remove high frequencies (for example, high frequency noise) superimposed on the output signal So2 input from the comparator 141. As a result, the protection unit 14 can achieve improved accuracy for detecting overcurrent and short-circuit current in the IGBT 21.

The logic circuit 144 is configured by, for example, an OR gate. One input terminal of the logic circuit 144 is connected to the control device 6 (see FIG. 1). This causes the one input terminal of the logic circuit 144 to receive the input signal Vin output by the control device 6. The other input terminal of the logic circuit 144 is connected to the output terminal of the delay circuit 143. This causes the output signal So2 input from the delay circuit 143 and delayed by a predetermined time is input to the other input terminal of the logic circuit 144. An output terminal of the logic circuit 144 is connected to the gate of the MOS transistor 125 included in the gate signal generation unit 12. This allows the logic circuit 144 to output to the gate of the MOS transistor 125 the protection signal Sgd obtained by calculation (a logical sum in the present embodiment) of the input signal Vin input from the control device 6 and the output signal So2 input from the delay circuit 143.

As illustrated in FIG. 2, the disconnection unit 11 includes a comparator 112 (an example of a comparison unit) connected to the current detection unit 13 and configured to compare the detection voltage Vs detected by the current detection unit 13 with a comparison voltage V1 (an example of a first voltage) corresponding to the first current. The disconnection unit 11 includes a voltage generation unit 113 configured to generate a reference voltage used as a reference for comparison in the comparator 112. The disconnection unit 11 includes a delay circuit 114 arranged at an output side of the comparator 112 and a logic circuit 115 arranged at an output side of the delay circuit 114. Furthermore, the disconnection unit 11 includes a complementary switch circuit 111 arranged at an output side of the logic circuit 115.

The voltage generation unit 113 is configured by, for example, a DC power supply. A negative side of the voltage generation unit 113 is connected to the reference potential terminal 41. The voltage generation unit 113 is adapted to generate the comparison voltage V1 at a predetermined voltage level. The comparison voltage V1 is set on a basis of a voltage corresponding to the absolute maximum rated current of the IGBT 21. The comparison voltage V1 is set to, for example, a lower value than the comparison voltage V2 generated by the voltage generation unit 142 included in the protection unit 14.

The comparator 112 is, for example, a hysteresis comparator configured by an operational amplifier and an unillustrated resistor element. A non-inverting input terminal (+) of the comparator 112 is connected to the current detection terminal S and the one terminal of the resistor element 131. An inverting input terminal (−) of the comparator 112 is connected to a positive side of the voltage generation unit 113. An output terminal of the comparator 112 is connected to an input terminal of the delay circuit 114. When the detection voltage Vs input from the current detection unit 13 is equal to or higher than the comparison voltage V1 (i.e., the comparison voltage V1 or higher) generated by the voltage generation unit 113, the comparator 112 outputs an output signal So1 at a high voltage level to the delay circuit 114. Additionally, when the detection voltage Vs is lower than the comparison voltage V1, the comparator 112 outputs the output signal So1 at a low voltage level to the delay circuit 114.

The input terminal of the delay circuit 114 is connected to the output terminal of the comparator 112. An output terminal of the delay circuit 114 is connected to input terminals of the logic circuit 115 (details will be described later). Therefore, the output signal So1 output from the comparator 112 is input to the delay circuit 114. The delay circuit 114 is configured by, for example, an RC filter. The delay circuit 114 delays the output signal So1 input from the comparator 112 by a predetermined time and outputs it to the logic circuit 115.

The delay circuit 114 can exert the same function as that of the delay circuit 143 included in the protection unit 14 to prevent the disconnection unit 11 from malfunctioning due to noise suddenly occurring in the power conversion device 1. Furthermore, similarly to the delay circuit 143, the delay circuit 114 functions as a low-pass filter, and thus can remove high frequencies (for example, high frequency noise) superimposed on the output signal So1 input from the comparator 112. As a result, the protection unit 11 can achieve improved operational stability.

The logic circuit 115 is configured by, for example, an AND gate. The two input terminals of the logic circuit 115 are both connected to the output terminal of the delay circuit 114. Therefore, the output signals So1 input from the delay circuit 114 and delayed by a predetermined time are input the logic circuit 115. An output terminal of the logic circuit 115 is connected to a gate of each of MOS transistors 111a and 111b (details will be described later). Thus, the logic circuit 115 can output to the gate of each of the MOS transistors 111a and 111b a disconnection signal Sc obtained by calculation (a logical product in the present embodiment) of the output signals So1 input to the two input terminals thereof from the delay circuit 114.

As illustrated in FIG. 2, the disconnection unit 11 includes, for example, the MOS transistor 111a of p-type (an example of a disconnection switch) configured to disconnect the connection between the gate capacitor 30 and the gate G of the IGBT 21 when the detection current detected by the current detection unit 13 is equal to or larger than the first current. Additionally, the disconnection unit 11 includes, for example, the MOS transistor 111b of n-type (an example of a connection switch) configured to connect the gate capacitor 30 to the reference potential terminal 41 when the detection current is equal to or larger than the first current.

The MOS transistors 111a and 111b are in a complementary configuration in which they are connected in series between the gate G of the IGBT 21 and the reference potential terminal 41. Therefore, the disconnection unit 11 includes the complementary switch circuit 111 configured by the MOS transistors 111a and 111b.

A source of the MOS transistor 111a is connected to the gate G of the IGBT 21. Additionally, the source of the MOS transistor 111a is connected to the drain of each of the MOS transistor 122b and the MOS transistor 125 included in the gate signal generation unit 12. A drain of the MOS transistor 111a is connected to a drain of the MOS transistor 111b. A source of the MOS transistor 111b is connected to the reference potential terminal 41.

A gate of the MOS transistor 111a and a gate of the MOS transistor 111b are connected to each other. The output terminal of the logic circuit 115 included in the disconnection unit 11 is connected to the gates of the MOS transistors 111a and 111b. The gate capacitor 30 is connected to the drains of the MOS transistors 111a and 111b. A connection portion between the gate of the MOS transistor 111a and the gate of the MOS transistor 111b is an input terminal of the complementary switch circuit 111. Therefore, the logic circuit 115 is arranged at an input side of the complementary switch circuit 111. In other words, the output terminal of the logic circuit 115 is connected to the input terminal of the complementary switch circuit 111. A connection portion between the drain of the MOS transistor 111a and the drain of the MOS transistor 111b is an output terminal of the complementary switch circuit 111. Therefore, the gate capacitor 30 is arranged at an output side of the complementary switch circuit 111.

One electrode of the gate capacitor 30 is connected to the drains of the MOS transistors 111a and 111b. The other electrode of the gate capacitor 30 is connected to an emitter terminal E of the IGBT 21, the other terminal of the resistor element 131, and the reference potential terminal 41. As a result, with the one electrode of the gate capacitor 30 being connected to the output terminal of the complementary switch circuit 111, the gate capacitor 30 is arranged between the output terminal of the complementary switch circuit 111 and the reference potential terminal 41.

Operation of Semiconductor Device

Operation of the semiconductor device 2a according to the present embodiment will be described in FIG. 2 with reference to FIG. 1.

Normal Operation

When the input signal Vin at a high voltage level is input from the control device 6 (see FIG. 1) in a normal state where there is no overcurrent or short-circuit current flowing between the collector C and the emitter E of the IGBT 21, the gate signal generation unit 12 included in the semiconductor device 2a goes into a non-operation state and does not output the gate signal Sg to the gate G of the IGBT 21. More specifically, as illustrated in FIG. 2, the MOS transistor 124 goes into the on state when the input signal Vin at the high voltage level is input to the gate. Therefore, since the gate of the MOS transistor 123 is connected to the reference potential terminal 41 via the MOS transistor 124, the MOS transistor 123 goes into the off state. As a result, the current mirror circuit 122 does not pass current through the reference potential terminal 41, so that the gate signal generation unit 12 does not output the gate signal Sg to the gate G of the IGBT 21. Additionally, in other words, when the input signal Vin at the high voltage level is input from the control device 6, the gate signal generation unit 12 outputs the gate signal Sg at a low voltage level to the IGBT 21. This causes the IGBT 21 to go into the off state. As a result, since no current flows between the collector-emitter of the IGBT 21, the detection current Is also does not flow from the current detection terminal S.

When the gate signal generation unit 12 does not output the gate signal Sg to the gate G of the IGBT 21 in the normal state where there is no overcurrent or short-circuit current flowing between the collector C and the emitter E of the IGBT 21, the current detection terminal S of the IGBT 21 does not output the detection current Is. Therefore, since no voltage drop occurs across the resistor element 131 included in the current detection unit 13, the detection voltage Vs becomes lower than the comparison voltage V1 and the comparison voltage V2.

As a result, the delay circuit 143 included in the protection unit 14 outputs the output signal So2 at a low voltage level to the other input terminal of the logic circuit 144. While the delay signal at the low voltage level is input to the other input terminal of the logic circuit 144, the input signal Vin at the high voltage level is input to the one input terminal of the logic circuit 144. Therefore, the logic circuit 144 outputs the protection signal Sgd at a high voltage level to the MOS transistor 125 included in the gate signal generation unit 12. This causes the MOS transistor 125 to go into the on state. As a result, the gate G of the IGBT 21 is electrically connected to the reference potential terminal 41.

In addition, the disconnection unit 11 outputs the disconnection signal Sc at a low voltage level to the input terminal of the complementary switch circuit 111. This causes the MOS transistor 111a to go into the on state and causes the MOS transistor 111b to go into the off state. As a result, the gate capacitor 30 is connected to the gate G of the IGBT 21 via the MOS transistor 111a. When the gate capacitor 30 is charged, electrical charge charged in the gate capacitor 30 is discharged to the reference potential terminal 41 via the MOS transistor 111a and the MOS transistor 125.

When the input signal Vin at a low voltage level is input from the control device 6 in the normal state where there is no overcurrent or short-circuit current flowing between the collector C and the emitter E of the IGBT 21, the gate signal generation unit 12 goes into an operation state and outputs the gate signal Sg to the IGBT 21. More specifically, as illustrated in FIG. 2, since the input signal Vin at the low voltage level is input to the gate of the MOS transistor 124, the MOS transistor 124 goes into the off state. Therefore, the gate of the MOS transistor 123 is electrically disconnected from the reference potential terminal 41 by the MOS transistor 124. As a result, since the output signal So3 output from the amplifier 121 is input to the gate of the MOS transistor 123, a predetermined constant current flows through the MOS transistor 123 and the resistor element 126 from the MOS transistor 122a included in the current mirror circuit 122. Furthermore, a gate current having the same current amount as the constant current flows through the gate G of the IGBT 21 from the MOS transistor 122b included in the current mirror circuit 122. In other words, the gate signal Sg at a high voltage level is input to the gate of the IGBT 21.

This causes the IGBT 21 to switch from the off state to the on state, and a collector-emitter current flows between the collector C and the emitter E. Furthermore, the detection current Is having a predetermined current amount based on the collector-emitter current flows through the resistor element 131 included in the current detection unit 13 from the current detection terminal S of the IGBT 21.

The detection voltage Vs based on the detection current Is in the normal state where there is no overcurrent or short-circuit current flowing between the collector C and the emitter E of the IGBT 21 becomes lower than the comparison voltages V1 and V2.

This causes the delay circuit 143 included in the protection unit 14 to output the output signal So2 at a low voltage level to the other input terminal of the logic circuit 144. The input signal Vin at the low voltage level is input to the one input terminal of the logic circuit 144. Therefore, the logic circuit 144 outputs the protection signal Sgd at a low voltage level to the MOS transistor 125 included in the gate signal generation unit 12. This causes the MOS transistor 125 to go into the off state. As a result, the gate G of the IGBT 21 is electrically disconnected from the reference potential terminal 41.

Additionally, the disconnection unit 11 outputs the disconnection signal Sc at a low voltage level to the input terminal of the complementary switch circuit 111. This causes the MOS transistor 111a to go into the on state and causes the MOS transistor 111b to go into the off state. As a result, the gate capacitor 30 is connected to the gate G of the IGBT 21 via the MOS transistor 111a. Thus, when the comparator 112 outputs the output signal So1 indicating that the detection voltage Vs is lower than the comparison voltage V1, the MOS transistor 111a does not disconnect the connection between the gate capacitor 30 and the gate G of the IGBT 21, and the MOS transistor 111b disconnects the gate capacitor 30 from the reference potential terminal 41. As a result, current flows through the gate capacitor 30 via the MOS transistor 122b and the MOS transistor 111a to charge electrical charge. Although details will be described later, the semiconductor device 2a electrically connects the gate capacitor 30 to the gate G of the IGBT 21 in the normal state where there is no overcurrent or short-circuit current flowing, whereby the recovery voltage change rate (dv/dt) can be reduced to suppress radiated noise.

When the detection current Is corresponding to the collector-emitter current of the IGBT 21 based on a duty ratio of the input signal Vin that is a pulsed signal is smaller than the first current, the detection voltage Vs is lower than the comparison voltage V1. This causes the gate capacitor 30 to be electrically connected to the gate G of the IGBT 21. On the other hand, when the detection current Is corresponding to the collector-emitter current of the IGBT 21 based on the duty ratio of the input signal Vin is equal to or larger than the first current, the detection voltage Vs is higher than the comparison voltage V1. This causes the gate capacitor 30 to be electrically disconnected from the gate G of the IGBT 21. Although details will be described later, the semiconductor device 2a controls whether or not to electrically disconnect the gate capacitor 30 from the gate G of the IGBT 21 on the basis of whether or not the detection current Is corresponding to the collector-emitter current flowing through the IGBT 21 is equal to or larger than the first current. As a result, the semiconductor device 2a can reduce radiated noise when the detection current Is is small (i.e., the collector-emitter current is small), and can reduce loss in the IGBT 21 when the detection current Is is large (i.e., the collector-emitter current is large).

Operation at Overcurrent

Assume that when overcurrent flows between the collector C and the emitter E of the IGBT 21, the detection voltage Vs based on the detection current Is detected according to the overcurrent is higher than the comparison voltage V2. Then, the comparator 141 included in the protection unit 14 outputs the output signal So2 at a high voltage level to the delay circuit 143. This causes the delay circuit 143 to output the output signal So2 delayed by a predetermined time to the other input terminal of the logic circuit 144. Since the output signal So2 at the high voltage level is input to the other input terminal of the logic circuit 144, the logic circuit 144 outputs the protection signal Sgd at a high voltage level to the MOS transistor 125 included in the gate signal generation unit 12 regardless of the voltage level of the input signal Vin. This puts the MOS transistor 125 in the on state, whereby the gate G of the IGBT 21 is electrically connected to the reference potential terminal 41. As a result, even when the semiconductor device 2a is operating in such a manner that the input signal Vin at a low voltage level is input to the gate signal generation unit 12 and the gate signal Sg is input to the gate G of the IGBT 21, the gate signal Sg is not input to the IGBT 12.

This causes the IGBT 21 to switch to the off state, so that no overcurrent flows through the IGBT 21, which prevents damage to the IGBT 21. In this way, the protection unit 14 can protect the IGBT 21 by preventing the gate signal Sg from being input to the gate G of the IGBT 21.

Assume that when overcurrent flows between the collector C and the emitter E of the IGBT 21, the detection voltage Vs based on the detection current Is detected according to the overcurrent is higher than the comparison voltage V1. Then, the comparator 112 included in the disconnection unit 11 outputs the output signal So1 at a high voltage level to the delay circuit 114. This causes the delay circuit 114 to output the output signal So1 delayed by a predetermined time to the other input terminal of the logic circuit 115. Therefore, the logic circuit 115 outputs the disconnection signal Sc at a high voltage level to the input terminal of the complementary switch circuit 111. This puts the MOS transistor 111a in the off state and the MOS transistor 111b in the on state. When the comparator 112 outputs the output signal So1 indicating that the detection voltage Vs is higher than the comparison voltage V1, the MOS transistor 111a disconnects the connection between the gate capacitor 30 and the gate G of the IGBT 21, and the MOS transistor 111b connects the gate capacitor 30 to the reference potential terminal 41.

As a result, the gate capacitor 30 is electrically disconnected from the gate G of the IGBT 21 by the MOS transistor 111a, and is electrically connected to the reference potential terminal 41 via the MOS transistor 111b. This results in that no gate current flows through the gate capacitor 30, and electrical charge charged in the gate capacitor 30 is discharged to the reference potential terminal 41. Although details will be described later, the semiconductor device 2a can disconnect the gate capacitor 30 from the gate G of the IGBT 21 when overcurrent flows between the collector C and the emitter E of the IGBT 21, and thus can prevent the IGBT 21 from being damaged by oscillation in the loop circuit L including the gate capacitor 30.

Effects of Semiconductor Device

Figure 3:
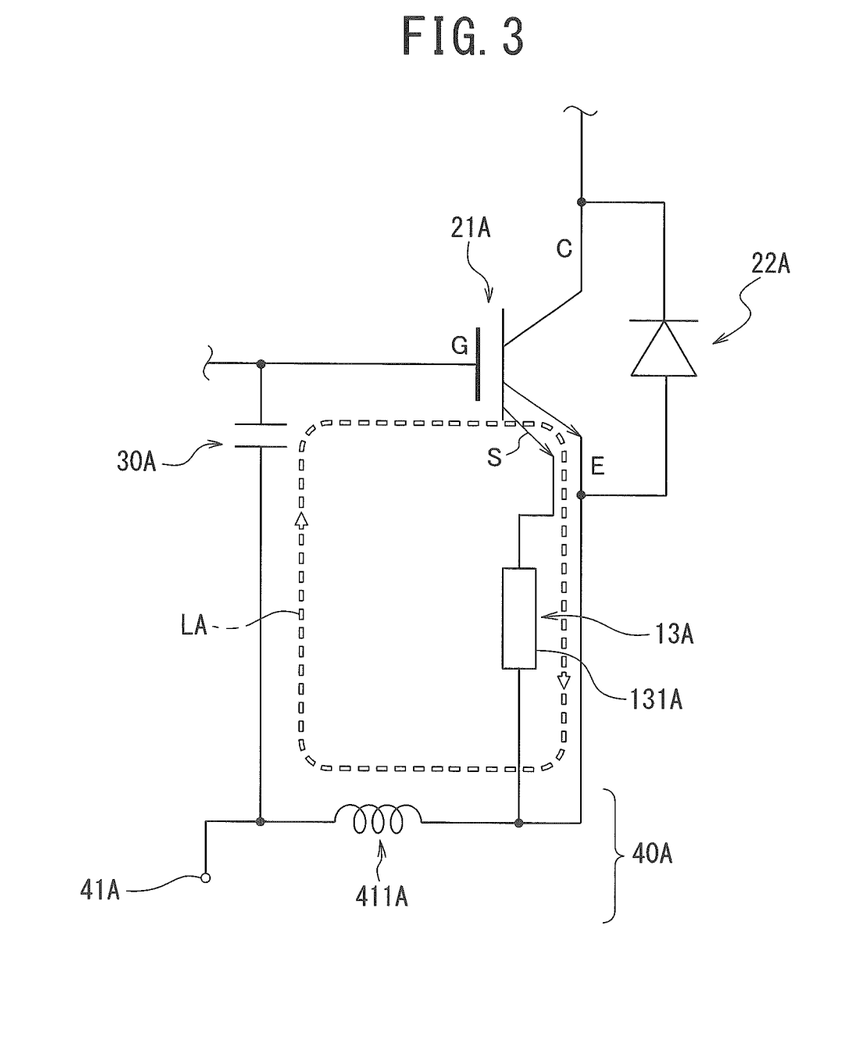
FIG. 3 is a diagram for explaining a problem of a semiconductor device used as a comparative example.

Next, using the semiconductor device 2a as an example, effects of the semiconductor device according to the present embodiment will be described in FIGS. 3 to 5 with reference to FIG. 2. First, in describing the effects of the semiconductor device according to the present embodiment, a semiconductor device used as a comparative example will be described in FIG. 3. The semiconductor device used as the comparative example has the same configuration as the semiconductor devices 2a to 2f according to the present embodiment, except that the former includes no disconnection unit. Therefore, FIG. 3 illustrates only a circuit configuration in the vicinity of a gate capacitor that differs the semiconductor device used as the comparative example from the semiconductor devices 2a to 2f. Note that illustration and description of a gate signal generation unit and a protection unit of the semiconductor device used as the comparative example are omitted.

In FIG. 4, the MOS transistors 111a and 111b are illustrated by switch circuit symbols in order to facilitate the understanding of an open/closed state. FIG. 4A is a circuit diagram including the disconnection unit 11 and the like, in which the MOS transistor 111a is in the on state (conduction state) and the MOS transistor 111b is in the off state (non-conduction state). FIG. 4B is a circuit diagram including the disconnection unit 11 and the like, in which the MOS transistor 111a is in the off state and the MOS transistor 111b is in the on state.

As illustrated in FIG. 3, the semiconductor device used as the comparative example includes a gate capacitor 30A connected between the gate G of an IGBT 21A and a reference potential terminal 41A formed on a printed circuit board 40A. Additionally, the semiconductor device used as the comparative example includes a current detection unit 13A connected to the current detection terminal S of the IGBT 21A. The current detection unit 13A includes a resistor element 131A connected between the current detection terminal S of the IGBT 21A and the reference potential terminal 41A. Note that a free-wheeling diode 22A is connected in anti-parallel to the IGBT 21A, similarly to the IGBT 21 of the present embodiment.

The gate capacitor 30A and the resistor element 131A are mounted on the printed circuit board 40A. The gate capacitor 30A and the resistor element 131A are connected by, for example, a wire formed on the printed circuit board 40A. The wire is connected to the reference potential terminal 41A. A parasitic inductance 411A is formed by the wire between the gate capacitor 30A and the emitter terminal E. Therefore, a loop circuit LA is formed by the emitter terminal E of the IGBT 21A, the parasitic inductance 411A, the gate capacitor 30A, and the gate G of the IGBT 21A.

Operation of the IGBT 21A causes a steep current change in the collector-emitter current (i.e., the main current) flowing through the IGBT 21A. Here, when an induction coefficient of the parasitic inductance 411A is defined as "La" and a current value of the collector-emitter current is defined as "i", an induced electromotive force of "La×di/dt" is generated in the parasitic inductance 411A. Even after the collector-emitter current stops flowing through the IGBT 21A, the induced electromotive force generated in the parasitic inductance 411A causes LC oscillation in the loop circuit LA. The induced electromotive force results from the magnitude of a recovery current that flows during operation of the IGBT 21A. The larger the collector-emitter current flowing through the IGBT 21A, the larger the recovery current. Thus, as the collector-emitter current flowing through the IGBT 21A increases, the amplitude of a voltage generated in the loop circuit LA during the LC oscillation increases. Due to that, when the collector-emitter current flowing through the IGBT 21A exceeds a predetermined value, the amplitude of the voltage during the LC oscillation becomes greater than a withstand voltage at the gate G of the IGBT 21A, which may damage the IGBT 21A.

As illustrated in FIG. 4, in the semiconductor device 2a, the emitter terminal E of the IGBT 21 and the gate capacitor 30 are connected by a wire formed on the printed circuit board 40, as in the semiconductor device used as the comparative example. The wire is connected to the reference potential terminal 41. More specifically, the emitter terminal E of the IGBT 21 is connected to the other electrode of the gate capacitor 30 via the wire formed on the printed circuit board 40. Therefore, a parasitic inductance 411 is formed by the wire between the emitter terminal E of the IGBT 21 and the other electrode of the gate capacitor 30.

As illustrated in FIG. 4A, when the MOS transistor 111a is in the on state (conduction state) and the MOS transistor 111b is in the off state (non-conduction state), a loop circuit L is formed by the emitter terminal E of the IGBT 21, the parasitic inductance 411, the gate capacitor 30, the MOS transistor 111a, and the gate G of the IGBT 21A.

Similarly to the semiconductor device used as the comparative example, when the IGBT 21 operates and thereby a steep current change occurs in the collector-emitter current flowing through the IGBT 21, an induced electromotive force is generated in the parasitic inductance 411. When an induction coefficient of the parasitic inductance 411 is defined as "L1" and the current value of the collector-emitter current is defined as "i", the induced electromotive force generated in the parasitic inductance 411 can be expressed by "L1×di/dt"

As described above, in the semiconductor device 2a, when the MOS transistor 111a is in the on state, the loop circuit L is formed, and the induced electromotive force is generated in the parasitic inductance 411 in response to the operation of the IGBT 21. However, the semiconductor device 2a includes the disconnection unit 11, so that when the collector-emitter current (i.e., the main current) flowing through the IGBT 21 is equal to or larger than a predetermined value, the MOS transistor 111a switches from the on state to the off state, and the MOS transistor 111b switches from the off state to the on state, as illustrated in FIG. 4B. This causes the gate capacitor 30 to be electrically disconnected from the gate G of the IGBT 21 by the MOS transistor 111a. Thus, when the collector-emitter current flowing through the IGBT 21 is equal to or larger than the predetermined value, the loop circuit L is not formed, and therefore no LC oscillation occurs. As a result, even when a collector-emitter current equal to or larger than the predetermined value flows through the IGBT 21, a voltage higher than the withstand voltage at the gate G is prevented from being applied to the IGBT 21.

On the other hand, when the collector-emitter current flowing through the IGBT 21 is smaller than the predetermined value, the MOS transistor 111a is in the on state, so that the loop circuit L remains formed. However, in the case of the collector-emitter current flowing through the IGBT 21 smaller than the predetermined value, the recovery current is also small. Thus, the amplitude of a voltage generated in the loop circuit L during LC oscillation is smaller than the withstand voltage at the gate G of the IGBT 21.

In this way, the semiconductor device 2a can prevent the IGBT 21 from being damaged due to LC oscillation regardless of the current value of the collector-emitter current flowing through the IGBT 21. In addition, as indicated by a dashed arrow in FIG. 4B, the semiconductor device 2a can discharge electrical charge charged in the gate capacitor 30 to the reference potential terminal 41 via the MOS transistor 111b when the MOS transistor 111a is in the off state and the MOS transistor 111b is in the on state. Therefore, as illustrated in FIG. 4A, when the MOS transistor 111a switches from the off state to the on state and the MOS transistor 111b switches from the on state to the off state, the gate current input from the gate signal generation unit 12 (see FIG. 2) can be smoothly passed through the gate G of the IGBT 21 and the gate capacitor 30. The semiconductor device 2a can prevent increase in a switching speed of the IGBT 21 by the disconnection unit 11.

A capacitance value of the gate capacitor 30 is set according to the absolute maximum rated current of the IGBT 21, and is set to, for example, a value of from several nanofarads (nF) to several tens of nF. Parasitic capacitances such as a drain-source capacitance are formed in each of the MOS transistors 111a and 111b. Therefore, when the MOS transistor 111a is in the off state, a loop circuit is formed by the current detection terminal S of the IGBT 21, the resistor element 131, the parasitic inductance 411, the gate capacitor 30, the drain-source capacitance formed in each of the MOS transistors 111a and 111b, and the gate G of the IGBT 21. However, the capacitance value of the parasitic capacitance is from several picofarads (pF) to several tens of pF, and is very small compared with that of the gate capacitor 30. Accordingly, in the loop circuit, there occurs no LC oscillation that is a voltage amplitude greater than the withstand voltage at the gate G of the IGBT 21.

Next, other effects of the semiconductor device according to the present embodiment will be described in FIG. 5 with reference to FIGS. 2 to 4. Characteristics α indicated by a dashed curve in FIG. 5 represent characteristics of recovery voltage change rate with respect to the collector-emitter current of the IGBT in the semiconductor device according to the present embodiment. Characteristics β1 indicated by a curve connecting x marks in FIG. 5 represent characteristics of recovery voltage change rate with respect to the collector-emitter current of the IGBT in the semiconductor device used as the comparative example illustrated in FIG. 3. Characteristics β2 indicated by a curve connecting rhombus marks in FIG. 5 represent characteristics of recovery voltage change rate with respect to the collector-emitter current of the IGBT in a case where the gate capacitor has been removed from the semiconductor device used as the comparative example illustrated in FIG. 3. The characteristics β1 and β2 are illustrated by measured values. The characteristics α represent simulation results obtained by setting electrical characteristics of the IGBT included in the semiconductor device according to the present embodiment to be the same as electrical characteristics of the IGBT used in the semiconductor device as the comparative example from which the characteristics β1 and β2 were obtained.

Figure 5:
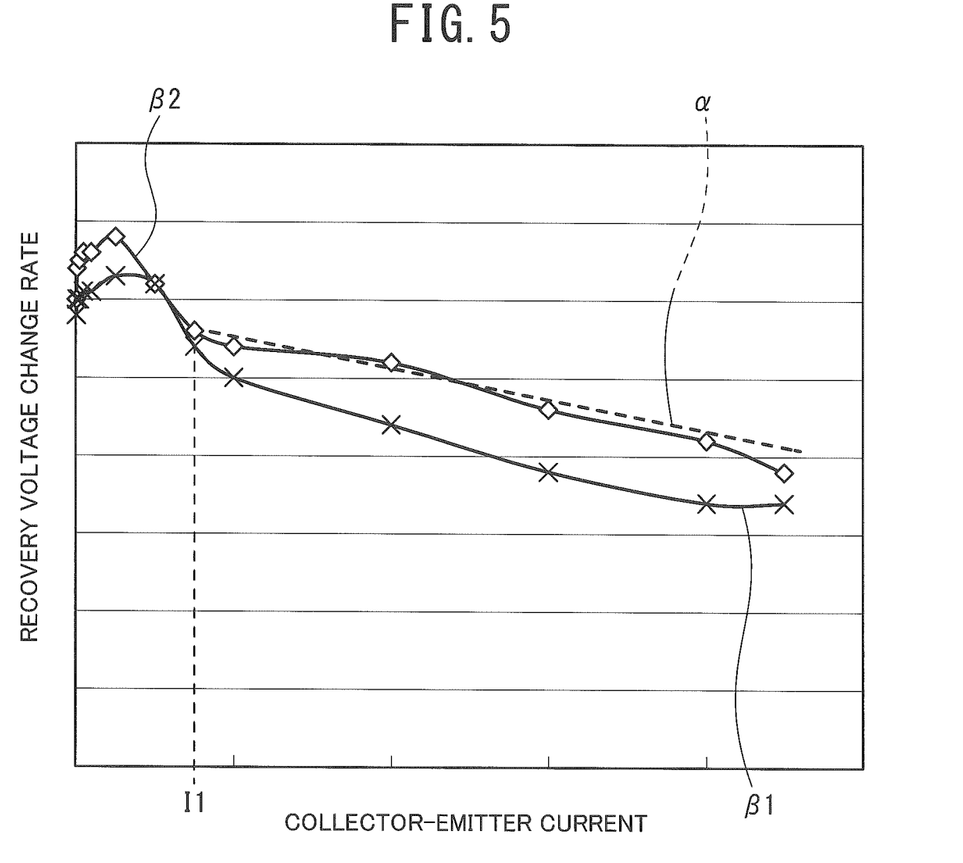
FIG. 5 is a diagram for explaining effects of the semiconductor device according to an embodiment of the present invention, which is a diagram illustrating an example of a relationship between current flowing through a switching element and recovery voltage change rate.

The symbol "I1" illustrated in FIG. 5 represents a collector-emitter current when the detection current Is having the same magnitude as the first current is output from the current detection terminal S of the IGBT 21. On the horizontal axis of a graph illustrated in FIG. 5, the collector-emitter current increases from left to right. On the vertical axis of the graph illustrated in FIG. 5, the recovery voltage change rate increases from bottom to top. Additionally, the larger the recovery voltage change rate, the smaller the loss in the IGBT. Furthermore, the larger the recovery voltage change rate, the larger the radiated noise generated during switching of the IGBT. In other words, there is a trade-off relationship between loss in the IGBT and radiated noise in terms of the magnitude of the recovery voltage change rate.

As illustrated in FIG. 5, the semiconductor devices including the gate capacitor (see the characteristics α and the characteristics β1) can reduce the recovery voltage change rate more than the semiconductor device including no gate capacitor (see the characteristics β2). Therefore, the semiconductor devices 2a to 2f according to the present embodiment can reduce radiated noise generated during switching of the IGBT 21 more than the semiconductor device including no gate capacitor.

Additionally, as illustrated in FIG. 5, the semiconductor device used as the comparative example including the gate capacitor (the characteristics (β1) has a smaller recovery voltage change rate than the semiconductor device used as the comparative example including no gate capacitor (the characteristics (β2) in a range where the collector-emitter current of the IGBT is larger than the current value I1. Accordingly, while including the gate capacitor in the semiconductor device used as the comparative example can reduce radiated noise generated during switching of the IGBT, it also increases loss, in the range where the collector-emitter current of the IGBT is larger than the current value I1.

On the other hand, the semiconductor devices 2a to 2f according to the present embodiment include the disconnection unit 11, and therefore can disconnect the gate capacitor 30 from the gate G of the IGBT 21 when the IGBT 21 passes a collector-emitter current having a current value equal to or larger than the current value I1. This puts the semiconductor devices 2a to 2f in a state equivalent to a state without the gate capacitor 30 when the IGBT 21 passes a collector-emitter current having a current value equal to or larger than the current value I1. As a result, as illustrated in FIG. 5, the semiconductor devices 2a to 2f can have substantially the same recovery voltage change rate as that of the semiconductor device used as the comparative example including no gate capacitor and can reduce loss in the IGBT 21 even when the IGBT 21 passes a collector-emitter current having a current value equal to or larger than the current value I1.

As described above, the semiconductor devices 2a to 2f according to the present embodiment include the IGBT 21 including the gate G configured to be input the gate signal Sg and the current detection terminal S used to detect at least one of overcurrent or short-circuit current, the gate capacitor 30 arranged between the gate G and the reference potential terminal 41, the gate capacitor 30 being disconnected from the gate G as needed, and the disconnection unit 11 configured to disconnect a connection between the gate capacitor 30 and the gate G when the detection current Is being the current output from the current detection terminal S is equal to or larger than the first current set on the basis of a minimum current causing oscillation in the loop circuit L formed by including the IGBT 21 and the gate capacitor 30. This allows the semiconductor devices 2a to 2f to protect the IGBT 21 even though they include the gate capacitor 30 connected to the gate G of the IGBT 21.

Specifically, when the detection current Is equal to or larger than the current value of the first current is detected, the semiconductor devices 2a to 2f operate a semiconductor switch (MOS transistor 111a) included in the disconnection unit 11 to insulate the gate capacitor 30 from the gate G of the IGBT 21. In this way, the semiconductor devices 2a to 2f prevent the sense IGBT from being damaged due to malfunction and oscillation easily occur when the IGBT 21 is short-circuited, thereby achieving improved reliabilities of themselves and the power conversion device 1 using the semiconductor devices 2a to 2f and enabling reduction of radiated noise due to the gate capacitor 30 in a small current range.

Furthermore, the semiconductor devices 2a to 2f operate the semiconductor switch (MOS transistor 111a) included in the disconnection unit 11 to insulate the gate capacitor 30 from the gate G of the IGBT 21 in a large current range, thereby preventing the recovery voltage change rate from decreasing at large current to enable reduction of loss in the IGBT 21.

The present invention is not limited to the above embodiment, and various modifications can be made.

Although the semiconductor devices 2a to 2f according to the above embodiment include the IGBT 21 as the switching element, the present invention is not limited thereto. The switching element to be included in the semiconductor devices 2a to 2f may be any of an IGBT, a bipolar transistor, or a MOS transistor. Additionally, the switching element may be a wide bandgap semiconductor element containing SiC, GaN, diamond, a gallium nitride-based material, a gallium oxide-based material, AlN, AlGaN, ZnO, or the like.

Although the MOS transistors 111a and 111b in the above embodiment are in the complementary configuration in which they are connected in series between the gate G of the IGBT 21 and the reference potential terminal 41, the present invention is not limited thereto. Switches included in the disconnection unit 11 do not have to be in a complementary configuration as long as they operate in the same way as complementary switches. For example, a plurality of (for example, two) switches included in the disconnection unit 11 may be configured such that they are individually controlled by different signals.

In the above embodiment, the logic circuit 115 is configured by the AND gate, and the logic circuit 144 is configured by the OR gate. However, the present invention is not limited thereto. The logic circuits 115 and 144 may be formed by other gate circuits as long as no logical inconsistency arises with respect to the operation of a circuit to be controlled.

Although the protection unit 14 included in each of the semiconductor devices 2a to 2f according to the above embodiment is configured to protect the IGBT 21 from at least one of overcurrent or short-circuit current, the present invention is not limited thereto. The semiconductor devices 2a to 2f may include a protection unit configured to protect the IGBT 21 from overcurrent and a protection unit configured to protect the IGBT 21 from short-circuit current.

The technological scope of the present invention is not limited to the exemplary embodiment illustrated and described, but rather encompasses all embodiments that have identical advantages to those for which the invention is intended. Furthermore, the technological scope of the invention is not limited to the combinations of features of the invention defined in the claims, but rather can be defined by any other desired combination of specific features out of all the disclosed individual features.

REFERENCE SIGNS LIST

1: Power conversion device
2: Inverter circuit
2a, 2b, 2c, 2d, 2e, 2f: Semiconductor device
2U: U-phase output arm
2V: V-phase output arm
2W: W-phase output arm
3: Three-phase AC power supply
4: Rectifier circuit
5: Smoothing capacitor
6: Control device
7: Motor
10: Gate drive circuit
11: Disconnection unit
111a, 111b, 122a, 122b, 123, 124, 125: MOS transistor
12: Gate signal generation unit
13, 13A: Current detection unit
14: Protection unit
20: Semiconductor element
21, 21A: Insulated gate bipolar transistor (IGBT)
22, 22A: Free-wheeling diode
30, 30A: Gate capacitor
40, 40A: Printed circuit board
41, 41A: Reference potential terminal
111: Complementary switch circuit
112, 141: Comparator
113, 127, 142: Voltage generation unit
114, 143: Delay circuit
115, 144: Logic circuit
121: Amplifier
122: Current mirror circuit
126, 131, 131A: Resistor element
411, 411A: Parasitic inductance
C: Collector
E: Emitter
G: Gate
I1: Current value
Is: Detection current
L, LA: Loop circuit
Ln: Negative line
Lp: Positive line
S: Current detection terminal
Sc: Disconnection signal
Sg: Gate signal (switching control signal)
Sgd: Protection signal
So1, So2, So3: Output signal
V1, V2: Comparison voltage
Vcc: Power supply voltage
Vin: Input signal
Vs: Detection voltage

The invention claimed is:

1. A semiconductor device comprising: a switching element including a control signal input terminal configured to receive a switching control signal and a current detection terminal; a capacitor arranged between the control signal input terminal and a reference potential terminal, the capacitor being directly connected to the control signal input terminal, the switching element and the capacitor being included in a loop circuit; and a disconnection unit coupled to the current detection terminal and the capacitor, and configured to disconnect the direct connection between the capacitor and the control signal input terminal when a detection current output by the current detection terminal is equal to or larger than a first current corresponding to a minimum current causing oscillation in the loop circuit including the switching element and the capacitor.

2. The semiconductor device according to claim 1, wherein the disconnection unit includes a disconnection switch configured to disconnect the connection between the capacitor and the control signal input terminal when the detection current output by the current detection terminal is equal to or larger than the first current, and a connection switch configured to connect the capacitor to the reference potential terminal when the detection current is equal to or larger than the first current.

3. The semiconductor device according to claim 2, wherein the disconnection switch and the connection switch are in a complementary configuration in which the switches are connected in series between the control signal input terminal and the reference potential terminal.

4. The semiconductor device according to claim 3, further comprising a current detection unit configured to detect the detection current as a voltage,
wherein the disconnection unit includes a comparison unit configured to compare the detection voltage detected by the current detection unit with a first voltage corresponding to the first current,
when the comparison unit outputs a signal indicating that the detection voltage is higher than the first voltage, the disconnection switch disconnects the connection between the capacitor and the control signal input terminal, and the connection switch connects the capacitor to the reference potential terminal, and
when the comparison unit outputs a signal indicating that the detection voltage is lower than the first voltage, the disconnection switch does not disconnect the connection between the capacitor and the control signal input terminal, and the connection switch disconnects the capacitor from the reference potential terminal.

5. The semiconductor device according to claim 4, wherein the switching element is any of an insulated gate bipolar transistor, a bipolar transistor, or a metal-oxide-semiconductor field-effect transistor.

6. The semiconductor device according to claim 3, wherein the switching element is any of an insulated gate bipolar transistor, a bipolar transistor, or a metal-oxide-semiconductor field-effect transistor.

7. The semiconductor device according to claim 2, further comprising a current detection unit configured to detect the detection current as a voltage, wherein the disconnection unit includes a comparison unit configured to compare the detection voltage detected by the current detection unit with a first voltage corresponding to the first current, when the comparison unit outputs a signal indicating that the detection voltage is higher than the first voltage, the disconnection switch disconnects the connection between the capacitor and the control signal input terminal, and the connection switch connects the capacitor to the reference potential terminal, and when the comparison unit outputs a signal indicating that the detection voltage is lower than the first voltage, the disconnection switch does not disconnect the connection between the capacitor and the control signal input terminal, and the connection switch disconnects the capacitor from the reference potential terminal.

8. The semiconductor device according to claim 7, further comprising a control signal generation unit configured to generate a switching control signal provided to the control signal input terminal and a protection unit configured to protect the switching element by preventing the switching control signal output from the control signal generation unit from being input to the control signal input terminal when the detection current is equal to or larger than a second current set on a basis of an absolute maximum rated current of the switching element.

9. The semiconductor device according to claim 8, further comprising a control circuit including a semiconductor substrate, the disconnection unit, the current detection unit, the control signal generation unit, and the protection unit formed on the semiconductor substrate and configured to control the switching element, wherein the capacitor is connected to the control circuit.

10. The semiconductor device according to claim 9, further comprising a circuit board mounted with the control circuit and the capacitor.

11. The semiconductor device according to claim 10, wherein a semiconductor element including the switching element and a diode connected in anti-parallel to the switching element and the circuit board are formed in a module configuration packaged in one.

12. The semiconductor device according to claim 11, wherein the switching element is any of an insulated gate bipolar transistor, a bipolar transistor, or a metal-oxide-semiconductor field-effect transistor.

13. The semiconductor device according to claim 10, wherein the switching element is any of an insulated gate bipolar transistor, a bipolar transistor, or a metal-oxide-semiconductor field-effect transistor.

14. The semiconductor device according to claim 9, wherein the switching element is any of an insulated gate bipolar transistor, a bipolar transistor, or a metal-oxide-semiconductor field-effect transistor.

15. The semiconductor device according to claim 8, wherein the switching element is any of an insulated gate bipolar transistor, a bipolar transistor, or a metal-oxide-semiconductor field-effect transistor.

16. The semiconductor device according to claim 7, wherein the switching element is any of an insulated gate bipolar transistor, a bipolar transistor, or a metal-oxide-semiconductor field-effect transistor.

17. The semiconductor device according to claim 2, wherein the switching element is any of an insulated gate bipolar transistor, a bipolar transistor, or a metal-oxide-semiconductor field-effect transistor.

18. The semiconductor device according to claim 1, wherein the switching element is any of an insulated gate bipolar transistor, a bipolar transistor, or a metal-oxide-semiconductor field-effect transistor.

* * * * *